United States Patent
Hara et al.

(10) Patent No.: US 7,407,818 B2
(45) Date of Patent: Aug. 5, 2008

(54) METHOD FOR MANUFACTURING A SEMICONDUCTOR DEVICE

(75) Inventors: Kousuke Hara, Tokyo (JP); Toshihiko Kamatani, Tokyo (JP); Masaki Yoshimaru, Tokyo (JP); Motoki Kobayashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 209 days.

(21) Appl. No.: 11/276,407

(22) Filed: Feb. 28, 2006

(65) Prior Publication Data

US 2006/0199392 A1    Sep. 7, 2006

(30) Foreign Application Priority Data

Mar. 7, 2005    (JP)    ............... 2005-061954

(51) Int. Cl.
*H01L 21/00*    (2006.01)
(52) U.S. Cl. .......................................... 438/3; 438/396
(58) Field of Classification Search ............ 438/3, 438/396; 257/295, 532

See application file for complete search history.

(56) References Cited

U.S. PATENT DOCUMENTS

| 6,143,191 | A | 11/2000 | Baum et al. | |
|---|---|---|---|---|
| 6,485,988 | B2 * | 11/2002 | Ma et al. | 438/3 |
| 2002/0076936 | A1 | 6/2002 | Iguchi | |
| 2006/0073614 | A1 * | 4/2006 | Hara | 438/3 |

FOREIGN PATENT DOCUMENTS

| JP | 7/130712 A | 5/1995 |
|---|---|---|
| JP | 11/111695 A | 4/1999 |
| JP | 2002/110633 A | 4/2002 |

* cited by examiner

*Primary Examiner*—Mark Prenty
(74) *Attorney, Agent, or Firm*—Rabin & Berdo, P.C.

(57) ABSTRACT

A method for manufacturing a semiconductor device includes the steps of preparing a semiconductor substrate, forming a lower electrode having a laminated film of Ir and $IrO_2$ whose thickness is 100 nm or less over the semiconductor substrate, forming a capacity insulating film comprised of a metal oxide dielectric on the lower electrode, and forming an upper electrode comprised of a precious metal film on the capacity insulating film.

11 Claims, 5 Drawing Sheets

METHOD FOR MANUFACTURING A SEMICONDUCTOR DEVICE

BACKGROUND OF THE INVENTION

Field of the Invention

The present invention relates to a semiconductor device, especially a semiconductor device having a capacitor in which a metal oxide ferroelectric is included. Also, the present invention relates to a method of manufacturing the same.

A capacitor in which a metal oxide dielectric, especially a metal oxide ferroelectric (hereinafter called a ferroelectric), is used as a capacitor insulating film has been an important component of a ferroelectric memory. There are various ferroelectric capacitor structures, and the present mainstream of them is the stack capacitor structure. The stack ferroelectric capacitor has a structure in which an electrode and a ferroelectric film of a capacitor are extended to be located over a field oxide film or a gate electrode of a transistor, and a lower electrode of a capacitor and a diffusion layer of a transistor are connected by a plug. Because of this structure, the stack ferroelectric capacitor has excellent properties, in which the area occupied by a memory cell structure can be decreased while the capacitance can be increased by enlarging an area in which capacitor electrodes face with each other. Therefore, the stack ferroelectric capacitor structure is thought to be a highly suitable structure to enhance the degree of integration of a semiconductor device.

When a capacitor is formed with a ferroelectric (i.e., a metal oxide), a thermal treatment in an oxygen atmosphere at a high temperature (e.g., 600-800 degrees Celsius) is normally required to recover properties of the ferroelectric after sintering and/or etching are/is conducted for it. Because of this, precious metal, such as platinum (Pt) which has excellent oxidation resistance, is used as both electrodes that are in contact with a capacitor insulating film comprised of a ferroelectric. However, platinum, which is used as the material of electrodes of a ferroelectric capacitor, has high oxygen permeability, while it has excellent oxidation resistance. Therefore, when a lower electrode comprised of platinum is formed directly on a plug, oxygen permeates the lower electrode in the thermal treatment in which the above described oxygen atmosphere is applied, and thus the plug is oxidized. As a result, a problem is provoked in which the electrical conductivity between the plug and the lower electrode is inhibited. In order to cope with the problem, in other words, in order to inhibit oxidization of a plug, a precious metal film with low oxygen permeability, such as a laminated film of iridium (Ir) and iridium dioxide ($IrO_2$), is formed under a lower electrode comprised of Pt The chemical reactivity of precious metals, such as Pt and Ir which are used as the material of an electrode, is low. Therefore, when patterning is conducted for the precious metal film, physical etching has been heretofore used in which ion collision with a surface of the precious metal film is conducted with high kinetic energy to cause the precious metal atoms to be stripped away. An ion milling method with Ar gas is suggested as an example of physical etching. However, with physical etching such as the ion milling method, there is a problem in which a portion of the etched atoms is adhered to a side of an etching mask or the etched object, and thus a short is caused between the upper electrode and lower electrode of a capacitor. Also, when the etched object is etched, the etching mask is simultaneously etched. Therefore, it is difficult to set the etching selectivity between the etched object and the etching mask to be higher. As a result, it is difficult to form a cross-section of a capacitor in a desired shape. In order to cope with these difficulties, application of so-called reactive ion etching (RIE) has been attempted. RIE is an etching method in which chlorine or chlorine-containing gas are used, and the physical effects by accelerated ions and the chemical effects between the etching gas and the etched object are used in its etching mechanism. In a normal RIE, it is possible to set the etching selectivity between the etched object and the etching mask to be higher. However, it still has a problem in which reaction products reattach to a side of the etching mask or the etched object, and thus a sidewall film is formed thereon as with the physical etching such as the ion milling method.

For example, Japanese Patent Publications JP-A-7-130712 (especially pages 3-4, and FIG. 3), JP-A-11-111695 (especially pages 3-5, and FIG. 2), and JP-A-2002-110633 (especially pages 2-4, and FIG. 1) describe a method for manufacturing a semiconductor device in which a precious metal film is etched and reaction products generated in the etching process are inhibited from forming a sidewall film.

The invention described in Japanese Patent Publication JP-A-7-130712 is an etching method in which an alloy consisting primarily of Pt is etched. In this etching method, samples of the alloy consisting primarily of Pt are heated at a temperature of 350 degrees Celsius or more, and they are simultaneously patterned by RIE with chlorine-containing gas. This makes the etching rate higher, and inhibits reaction products comprised of Pt from reattaching to a side of an etching mask.

The invention described in Japanese Patent Publication JP-A-11-111695 is an etching method in which a thin Pt film is etched. In this etching method, samples including a thin Pt film are heated at a temperature of 220-340 degrees Celsius, and they are simultaneously patterned by RIE with a chloride gas or a mixed gas of boron chloride and an inert gas. This inhibits the reaction products comprised of Pt from reattaching to a side of an etching mask.

The invention described in Japanese Patent Publication JP-A-2002-110633 is an etching method in which a laminated film of Ir and $IrO_2$ is etched. In this etching method, the laminated film is patterned by RIE, while reaction products comprised of the etched film and the reaction gas (i.e., the mixed gas of $Cl_2$ and Ar), such as iridium chloride ($IrCl_x$), are formed as a sidewall film on the sides of the etching mask and the etched film. Then, in a plasma ashing process to eliminate the etching mask, samples are heated at a temperature of 250 degrees Celsius or more and they are simultaneously exposed to a plasma including oxygen and fluorine atoms, such as a plasma comprised of the mixed gas of $O_2$ and tetrafluoromethane ($CF_4$). Thus, the sidewall film is eliminated. In Patent Publication JP-A-2002-110633, etching is conducted by using a sidewall film adhered to the sides of the etching mask and the etched film in the etching process, and then the sidewall is eliminated in the plasma ashing process. Therefore, high anisotropic etching is realized without leaving a sidewall film.

As described above, etching a ferroelectric capacitor in which a precious metal is used as the material of an electrode has the following problem. That is, a sidewall film, which is comprised of reaction products generated in the etching process, is formed on a side of an etching mask or an etched object, and leakage current is generated by means of a short that is generated between the upper electrode and lower electrode of a capacitor. Especially, the vapor pressure of reaction products generated by chemical reactions between Ir and the etching gas is lower than that of reaction products generated by chemical reactions between the general electrode material Pt and the etching gas. Therefore it has been difficult to inhibit a sidewall film comprised of the reaction products consisting primarily of Ir from being formed when etching a film comprised of Ir or $IrO_2$.

In Japanese Patent Publication JP-A-7-130712, an etching method is described in which an alloy consisting primarily of Pt is etched, but not a method of inhibiting a sidewall film from being formed when etching Ir whose vapor pressure is lower than that of Pt.

In Japanese Patent Publication JP-A-11-111695, an etching method is described in which a thin Pt film is etched, but not a method to inhibit a sidewall film from being formed when etching Ir whose vapor pressure is lower than that of Pt.

In Japanese Patent Publication JP-A-2002-110633, an etching method is described in which a precious metal material such as Ir is etched, but it is thought to be difficult to control patterning while a sidewall film, which is comprised of reaction products generated by chemical reactions between the etched object film and the reaction gas, is formed. Also, it is though to be difficult to conduct fine processing.

In view of the above, it will be apparent to those skilled in the art from this disclosure that there exists a need for an improved semiconductor device and an improved method for manufacturing a semiconductor device. This invention addresses these needs in the art as well as other needs, which will become apparent to those skilled in the art from this disclosure.

SUMMARY OF THE INVENTION

It is therefore an objective of the present invention to resolve the above-described problems, and to provide a semiconductor device that includes a capacitor in which the leakage current generated between an upper electrode and a lower electrode is decreased, and which inhibits a sidewall film from being formed in etching the electrode materials Ir and $IrO_2$.

In accordance with a first aspect of the present invention, a semiconductor device is comprised of a semiconductor substrate, a lower electrode that is formed over the semiconductor device and comprised of a laminated film of Ir and $IrO_2$ whose thickness is 100 nm or less, a capacity insulating film that is formed on the lower electrode and comprised of a metal oxide dielectric, and an upper electrode that is formed on the capacity insulating film and comprised of a precious metal film.

In accordance with a second aspect of the present invention, in the semiconductor device according to the first aspect of the present invention, the thickness of Ir is 1 nm or more.

In accordance with a third aspect of the present invention, in the semiconductor device according to the first aspect of the present invention, the thickness of $IrO_2$ is 1 nm or more.

In accordance with a fourth aspect of the present invention, in the semiconductor device according to the first aspect of the present invention, the lower electrode is further comprised of a hydrogen diffusion barrier film that is laminated under a lower surface of Ir, and a precious metal film that is laminated on an upper surface of said $IrO_2$.

In accordance with a fifth aspect of the present invention, in the semiconductor device according to the fourth aspect of the present invention, the hydrogen diffusion barrier film is TiAlN.

In accordance with a sixth aspect of the present invention, in the semiconductor device according to the first aspect of the present invention, the precious metal film consists primarily of Pt.

In accordance with a seventh aspect of the present invention, in the semiconductor device according to the fourth aspect of the present invention, the precious metal film consists primarily of Pt.

In accordance with a eighth aspect of the present invention, in the semiconductor device according to the first aspect of the present invention, the metal oxide dielectric is comprised of one selected from the group consisting of a SBT compound, a PZT compound, and a BLT compound.

In accordance with a ninth aspect of the present invention, the semiconductor device according to the first aspect of the present invention further comprises a field-effect transistor formed in the semiconductor substrate, the field-effect transistor having a diffusion layer connected with the lower electrode by means of a plug.

According to the semiconductor device of the present invention, the maximum thickness of the laminated film comprised of Ir and $O_2$ in the lower electrode is set to be 100 nm or less. This can reduce the amount of a sidewall film, which is formed on the sides of the lower electrode, the capacitor insulating film, and the upper electrode, and is comprised of the reaction products that are generated by chemical reactions between the etching gas and Ir, to be a predetermined amount or less when etching Ir and $IrO_2$. In other words, even if a sidewall film comprised of the reaction products that are generated by chemical reactions between Ir and the etching gas is formed on the sides of the lower electrode, the capacitor insulating film, and the upper electrode, the leakage current generated between the upper electrode and the lower electrode can be reduced to be a reference value or less. In addition to this, it is also an objective to provide a method for manufacturing the above described semiconductor device. In accordance with the present invention, a method for manufacturing a semiconductor device is comprised of the steps of preparing a semiconductor substrate, forming a lower electrode comprised of a laminated film of Ir and $IrO_2$, whose thickness is 100 nm or less over the semiconductor substrate, forming a capacity insulating film comprised of a metal oxide dielectric on the lower electrode; and forming an upper electrode comprised of a precious metal film on the capacity insulating film.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
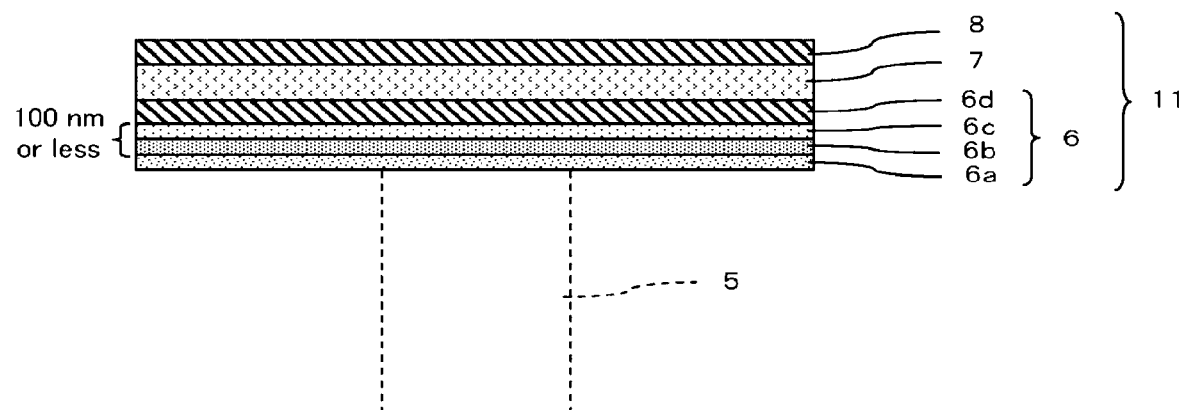
FIG. 1 is a diagram showing the structure of a ferroelectric capacitor formed in a semiconductor device in accordance with the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

Capacitor Structure

FIG. 1 is a diagram showing a structure of a ferroelectric capacitor 11 formed in a semiconductor device in accordance with the first embodiment of the present invention. In FIG. 1, as a matter of convenience, a plug 5 connected to a lower potion of the ferroelectric capacitor 11 is shown with a dotted line other than a structure of a ferroelectric capacitor 11. The ferroelectric capacitor 11 is comprised of a lower electrode 6, a capacitor insulating film 7 formed on the lower electrode 6, and an upper electrode 8 formed on the capacitor insulating film 7.

The lower electrode 6 is comprised of a laminated film of conductive films 6a, 6b, 6c, and 6d. This laminated film is formed by sequentially laminating the conductive films 6a, 6b, 6c, and 6d. The conductive film 6a is a hydrogen diffusion barrier film to prevent the properties of a ferroelectric, which is used as the material of the capacitor insulating film 7, from degrading by separation and diffusion of hydrogen and water generated from an isolating film that has a connection with the ferroelectric capacitor 11, especially, an isolating film (not shown in the figure) formed in a lower layer where the plug 5 is formed. The conductive film 6a is comprised of titanium aluminum nitride (TiAlN), for instance.

The conductive film 6b is an oxidation barrier film with respect to the plug 5 that is connected to the lower side of the conductive film 6a. In the first embodiment of the present invention, the minimum thickness of the conductive film 6b is set to be 1 nm, and the maximum thickness of the conductive film 6b is set so that the thickness of a laminated film comprised of the conductive films 6b and 6c is 100 nm or less. This is explained in detail in the section concerning the manufacturing method below. Because of this, the amount of a sidewall film that is formed on a side of the ferroelectric capacitor 11 and comprised of reaction products consisting primarily of Ir can be reduced to a predetermined amount or less in etching the conductive film 6b. The conductive film 6c is an oxidation barrier film with respect to the plug 5 as with the conductive film 6b. The conductive film 6c is comprised of iridium dioxide ($IrO_2$), for instance. In the first embodiment of the present invention, the minimum thickness of the conductive film 6c is set to be 1 nm, and the maximum thickness of the conductive film 6c is set so that the thickness of a laminated film comprised of the conductive films 6b and 6c is 100 nm or less. This is also explained in detail below. Because of this, the amount of a sidewall film that is formed on a side of the ferroelectric capacitor 11 and comprised of reaction products consisting primarily of Ir can be reduced to a predetermined amount or less in etching the conductive film 6c. Here, there are two reasons for forming the laminated film that is comprised of the conductive film 6b comprised of Ir and the conductive film 6c comprised of $IrO_2$ as an oxidation barrier film. The first reason is that forming the conductive film 6b between the plug 5 and the conductive film 6c (i.e., $IrO_2$) can prevent the plug 5 from being oxidized by oxygen in the $IrO_2$ that is used as the material of the conductive film 6c. The second reason is that forming the conductive film 6c (i.e., $IrO_2$) between the conductive film 6b (i.e., Ir) and the conductive film 6d prevents the Ir that is used as the material of the conductive film 6b from diffusing in the conductive film 6d formed over the conductive film 6b, and furthermore it prevents the Ir that is used as the material of the conductive film 6b from chemically reacting with a ferroelectric that is used as the material of the capacitor insulating film 7 formed on the conductive film 6d.

The conductive film 6d is a main electrode film of the lower electrode 6, and it is comprised of a precious metal (such as platinum (Pt)) with oxidation resistance. In the first embodiment of the present invention, the thickness of the conductive film 6d is not set to be a specific value. This is because the vapor pressure of the reaction products generated by chemical reactions between the etching gas (i.e., the chlorine gas) and the Pt that is used as the material of the conductive film 6d is high at an etching temperature of nearly 450 degrees Celsius, and reaction products consisting primarily of Pt on a surface of a sample easily vaporize. Thus the degree in which the reaction products reattach to a side of the ferroelectric capacitor 11 is decreased independent of the thickness of the Pt. This is explained in detail below.

The capacitor insulating film 7 is a ferroelectric film with hysteresis properties, and it may be comprised of a strontium bismuth tantalum (SBT or $SrBi_2Ta_2O_9$) compound, a lead zirconate titanate (PZT or Pb (Ti, Zr) $O_3$) compound, or a bismuth lanthanum titanate (BLT or (Bi, La)$_4$ Ti$_3$ O$_{12}$) compound, for instance.

The upper electrode 8 is comprised of a precious metal with oxidation resistance (e.g., Pt) as with the conductive film 6d in the lower electrode 6.

Manufacturing Method FIGS. 2A to 2G are simple diagrams sequentially showing the manufacturing processes of the structure of a portion of a semiconductor device that includes the above described ferroelectric capacitor 11, that is, the structure of a portion of a ferroelectric memory cell 100.

Figure 2A:
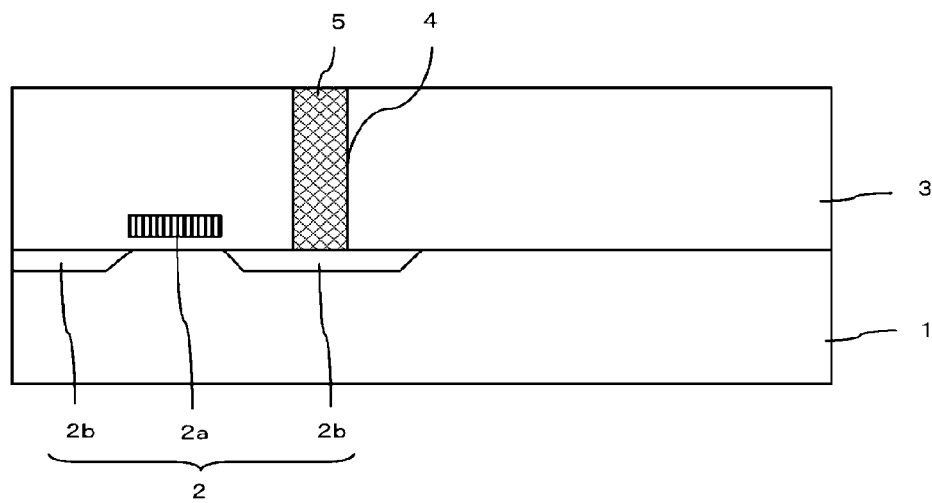
FIGS. 2A to 2G are diagrams showing the manufacturing processes of a semiconductor device in accordance with the first embodiment of the present invention.

First, as shown in FIG. 2A, a MOS transistor 2 is formed on a semiconductor substrate 1. The MOS transistor 2 is comprised of a gate electrode 2a and diffusion layers 2b that function as a source region and a drain region. Also, a portion of the elements of the MOS transistor 2 is not shown in FIG. 2A as a matter of convenience. Next, an insulating film 3 is formed on the semiconductor substrate 1 where the MOS transistor 2 is formed. Then, a contact hole 4, which exposes a portion of the diffusion layer 2b functioning as a drain region or a source region of the MOS transistor, is formed by photolithography and etching. After this, a plug 5, which is comprised of tungsten (W), for instance, is formed in the interior of the contact hole 4.

Figure 2B:
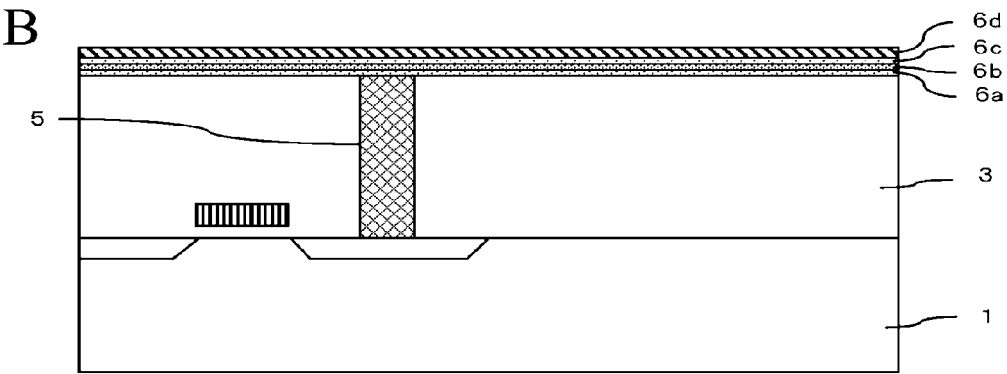

Next, as shown in FIG. 2B, conductive films 6a, 6b, 6c, and 6d are sequentially formed with the sputtering method. In the later process, as shown in FIG. 2F, a lower electrode 6 is comprised of these conductive films. The conductive film 6a is a hydrogen diffusion barrier film which serves to inhibit the properties of a ferroelectric film 7a from degrading by separation and diffusion of hydrogen and water generated from elements such as the insulating film 3 when manufacturing the ferroelectric memory cell 100. Also, the ferroelectric film 7a is used as the material of the capacitor insulating film 7 formed in the later process as shown in FIG. 2F. For example, a conductive film 6a of 50 nm in thickness is formed and is comprised of TiAlN. In forming the TiAlN film, TiN with a one-to-one composition ratio of Ti and N, is used as the sputtering target, and a mixed gas of Ar and $N_2$ is used as a sputtering gas, for instance. For example, the conditions for forming the film are set as follows. That is, the DC power is set to be 1 kW, and the temperature is set to be 200 degrees Celsius. The conductive film 6b is an oxidation barrier film with respect to the plug 5. For example, the conductive film 6b of 50 nm in thickness is formed and is comprised of Ir. In forming the Ir film, Ir is used as the sputtering target, and Ar is used as the sputtering gas, for instance. For example, the condition of forming the Ir film is set as follows. That is, the DC power is set to be 1 kW, and the temperature is set to be 400 degrees Celsius. The conductive film 6c is an oxidation barrier film with respect to the plug 5 as with the conductive film 6b that is formed under the conductive film 6c. For example, the conductive film 6c of 50 nm in thickness is formed and it is comprised of $IrO_2$. In forming the $IrO_2$ film, Ir is used as the sputtering target and a mixed gas of Ar and $O_2$ is used as the sputtering gas. For example, the condition of forming the $IrO_2$ film is set as follows. That is, the DC power is set to be 500 W, and the temperature is set to be 350 degrees Celsius. The conductive film 6d is a main electrode film in the lower electrode 6. For example, a conductive film 6d of 50 nm in thickness is formed and it is comprised of Pt. In forming the Pt film, Pt is used as the sputtering target and Ar is used as the sputtering gas, for instance. For example, the conditions for forming the film are set as follows. That is, the DC power is set to be 1 kW, and the temperature is set to be 200 degrees Celsius.

Figure 3:
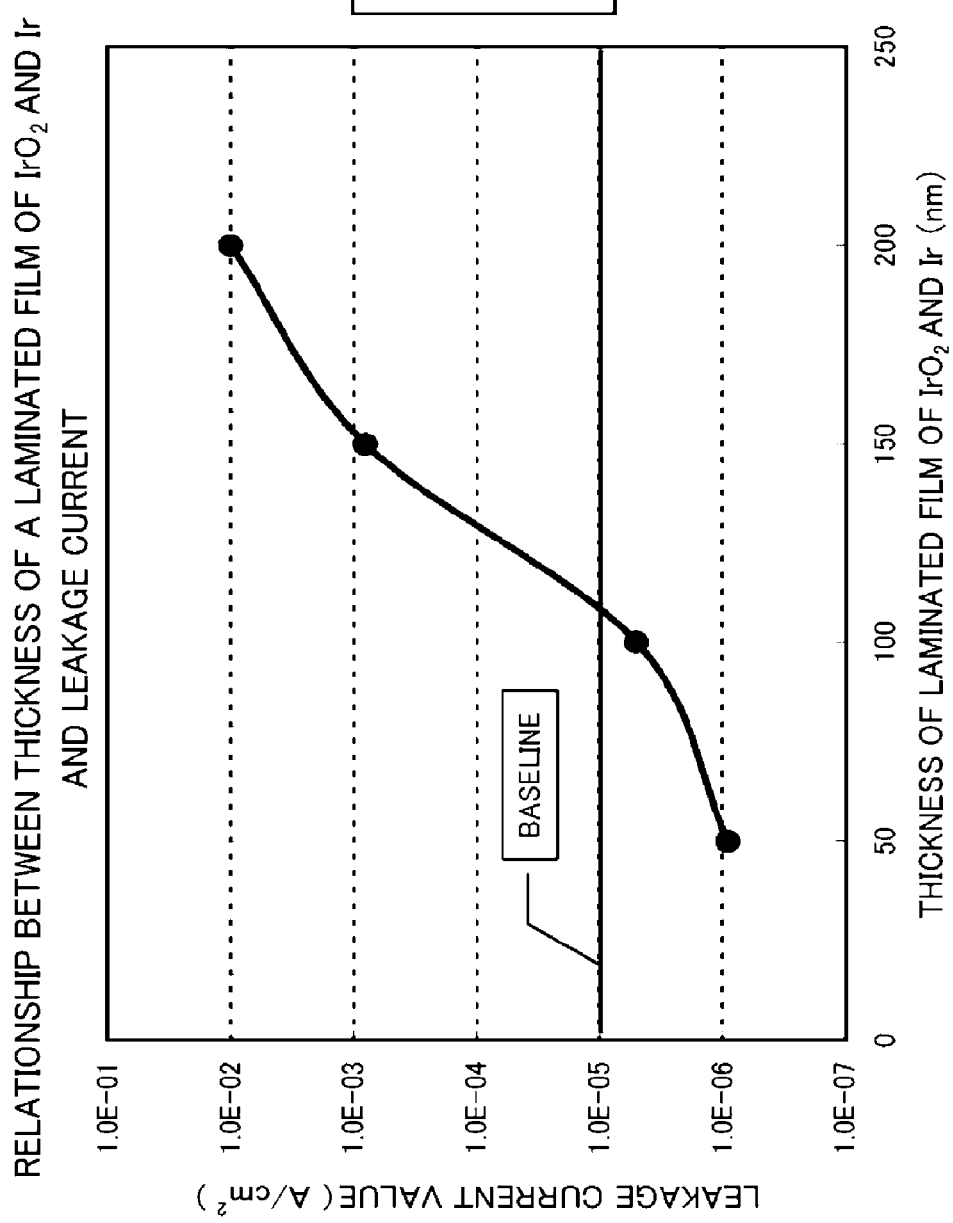
FIG. 3 is a diagram showing the relationship between thickness of a laminated film of $IrO_2$ and Ir and the leakage current between upper and lower electrodes.

As described above, the thickness of the conductive film 6b comprised of Ir and that of the conductive film 6c comprised of $IrO_2$ are set to be 50 nm, respectively, as an example of the first embodiment of the present invention. In practice, the minimum thickness and the maximum thickness of each of the conductive films 6b and 6c are set as follows. First, the minimum thickness of the conductive films 6b and 6c are set to be 1 nm, respectively. The minimum thickness is the threshold of the thickness of a film formed by the sputtering method. In other words, the minimum thickness corresponds to the thickness at which a film can keep the desired quality as an oxidation barrier film and the formation of a film can be controlled. On the other hand, the maximum thickness of the conductive films 6b and 6c are set so that the thickness of a laminated film comprised of the conductive films 6b and 6c is 100 nm or less. This maximum thickness is derived from the results of the experiment shown in FIG. 3. FIG. 3 shows the relationship between the thickness of a laminated film comprised of the conductive films 6b and 6c and the leakage current generated between an upper electrode 8 and the lower electrode 6.

Specifically, FIG. 3 shows the results of the measurement of the leakage current generated between the upper electrode 8 and the lower electrode 6 with varying thickness of a laminated film comprised of the conductive film 6b (i.e., Ir) and the conductive film 6c (i.e., $IrO_2$). As shown in the right diagram of FIG. 3, measurement of the leakage current means measurement of the current that passes between the upper electrode 8 and the lower electrode 6 in the ferroelectric capacitor 11 when a voltage of 3 V is applied between them. Here, there is a possibility that the leakage current, which is attributed to the formation of a sidewall film comprised of reaction products generated by chemical reactions between the etching gas (i.e., the chlorine gas) and Pt that is used as the material of the conductive film 6d in the lower electrode 6, is somewhat included in the experimental results shown in FIG. 3. However, the level of the leakage current attributed to the reaction products comprised of Pt is extremely small, compared to that of the leakage current attributed to the reaction products comprised of Ir. The reason for this is explained as follows. The evaporating temperature at 1 atmosphere pressure of the reaction products generated by chemical reactions between the etching gas (i.e., the chlorine gas) and Pt that is used as the material of the conductive film 6d is nearly 330 degrees Celsius. Therefore, the vapor pressure of the reaction products comprised of Pt under etching conditions at a chamber pressure of 1 or 2 mTorr and a stage temperature of 450 degrees Celsius is higher than that of the reaction products comprised of Ir. Because of this, the rate at which the reaction products comprised of Pt easily separate from the surface of samples and reattach to the sides of the ferroelectric capacitor 11 is decreased in the etching process. On the other hand, the evaporating temperature at 1 atmosphere pressure of the reaction products generated by chemical reactions between the etching gas (i.e., the chlorine gas) and Ir consisting primarily of the conductive films 6b and 6c is nearly 750 degrees Celsius. Therefore, the vapor pressure of the reaction products comprised of Ir under etching conditions at a chamber pressure of 1 or 2 mTorr and a stage temperature of 450 degrees Celsius is lower than that of the reaction products comprised of Pt. Therefore, reaction products comprised of Ir do not easily separate from the surface of samples in the etching process, and the amount of the reaction products comprised of Ir reattaching to the sides of the ferroelectric capacitor 11 is larger than that of the reaction products comprised of Pt reattaching to the sides of the ferroelectric capacitor 11. Because of this, a large portion of the sidewall film formed on the sides of the ferroelectric capacitor 11 is thought to be comprised of reaction products comprised of Ir, and the effect of a sidewall film comprised of Pt on the leakage current is thought to be extremely small. Form the above reasons, it can be concluded that the experimental results shown in FIG. 5 substantially shows only that the leakage current is dependent on the thicknesses of the conductive films 6b (i.e., Ir) and 6c (i.e., $IrO_2$). Also, in the experiment, the thicknesses of films other than the conductive films 6b (i.e., Ir) and 6c (i.e., $IrO_2$), that is, the thicknesses of the conductive film 6a (i.e., TiAlN), the conductive film 6d (i.e., Pt), the capacitor insulating film 7 (i.e., SBT), and the upper electrode 8 (i.e., Pt), are all set to be a constant value.

With reference to the experimental results shown in FIG. 5, when the reference value of the leakage current is set to be the value that a predetermined read-margin can be retained in the operation of the ferroelectric memory, that is, 10 $\mu A/cm^2$ (1.0 $e^{-5}$ $A/cm^2$), it can be understood that the leakage falls below the reference value if the thickness of a laminated film comprised of Ir and $IrO_2$ is set to be 100 nm or less. That is, the amount of a sidewall film that is formed on the sides of the ferroelectric capacitor 11 and comprised of the reaction products generated by chemical reactions between the etching gas (i.e., the chlorine gas) and Ir can be reduced to a predetermined amount or less when etching the ferroelectric capacitor 11 by setting the thickness of a laminated film comprised of the conductive films 6b (i.e., Ir) and 6c (i.e., $IrO_2$) to be 100 nm or less. In other words, even if a sidewall film is formed on the sides of the ferroelectric capacitor 11 and is comprised of the reaction products generated by chemical reactions between the etching gas (i.e., chlorine gas) and Ir, the level of the leakage current between the upper electrode 8 and the lower electrode 6 can be reduced to a level in which it does not influence the operation of the ferroelectric memory. Based on this experimental result, the maximum thicknesses of the conductive films 6b (i.e., Ir) and 6c (i.e., $IrO_2$) is set so that the thickness of the laminated film comprised of the conductive films 6b and 6c is 100 nm or less.

Figure 2C:
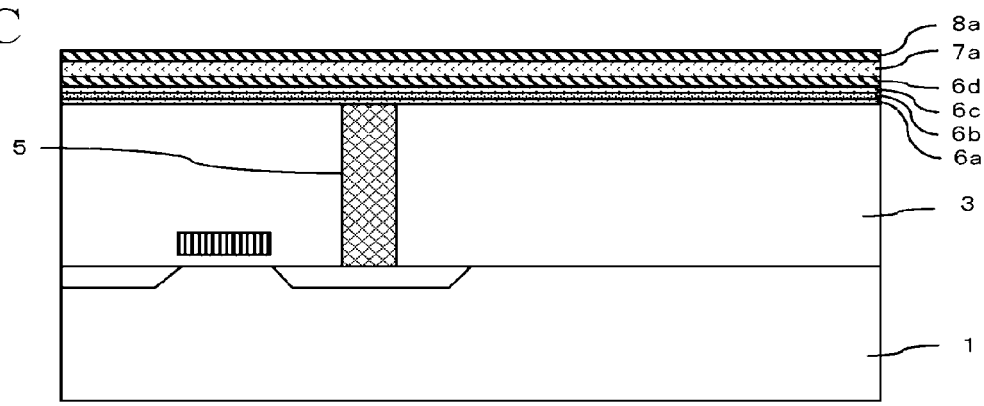

Next, as shown in FIG. 2C, the ferroelectric film 7a is formed on the conductive film 6d. The ferroelectric film 7a is processed to be the capacitor insulating film 7 in the later process as shown in FIG. 2F. The ferroelectric film 7a is comprised of SBT and its thickness is set to be 90-120 nm, for instance. The so-called sol-gel method is used in forming the SBT film. The sol-gel method is a method in which the precursor solution in which SBT is dissolved is spin-coated and then SBT is crystallized by a predetermined thermal treatment. Specifically, the SBT film is formed by repeating the sol-gel method three times as follows. In the first step of forming the SBT film, a precursor solution in which SBT is dissolved is applied at a thickness of 30-40 nm, and a thermal treatment in an oxygen atmosphere at a temperature of 700 degrees Celsius for 30 seconds is conducted in a furnace. In the second step of forming the SBT film, the precursor solution in which SBT is solved is applied at a thickness of 30-40 nm, and a thermal treatment in an oxygen atmosphere at a temperature of 700 degrees Celsius for 30 seconds is conducted in a furnace. In the third step of forming the SBT film, a precursor solution in which SBT is dissolved is applied at a thickness of 30-40 nm, and a thermal treatment in an oxygen atmosphere at a temperature of 800 degrees Celsius for 60 seconds is conducted in a furnace. Next, a conductive film $8a$ is formed on the ferroelectric film $7a$. The conductive film $8a$ is processed to be the upper electrode 8 in the later process as shown in FIG. 2F. The conductive film $8a$ is the main electrode film of the upper electrode 8. The conductive film $8a$ is comprised of Pt and its thickness is set to be 50 nm, for instance. In forming the Pt film, Pt is used as the sputtering target and Ar is used as the sputtering gas. For example, the conditions for forming the Pt film are set as follows. That is, the DC power is set to be 1 kW and the temperature is set to be 200 degrees Celsius. Also, a barrier film to inhibit chemical reactions between the Pt that is used as the material of the conductive film $8a$ and the Al that is used as the main wiring material (not shown in figures), such as a TiN film, may be formed on the conductive film $8a$.

Figure 2D:
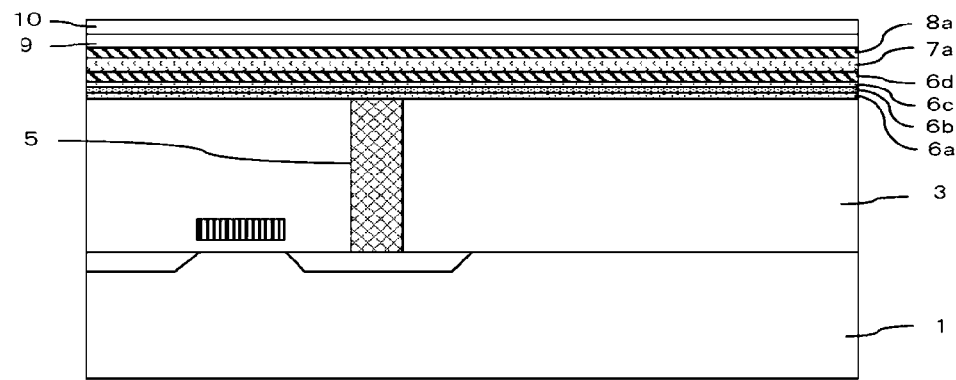

Next, as shown in FIG. 2D, a conductive film 9 is formed on the conductive film $8a$ with the sputtering method. Then, an insulating film 10 is formed on the conductive film 9 with the plasma chemical vapor deposition method (the plasma CVD method). The conductive film 9 and the insulating film 10 are processed to be an etching mask 9' and an etching mask 10' of a dual-layer structure, respectively, which are used as masks for patterning the conductive films $6a$, $6b$, $6c$, and $6d$, the ferroelectric film $7a$, and the conductive film $8a$ in the later process as shown in FIG. 2F. The conductive film 9 is comprised of TiN and its thickness is set to be 100 nm, for instance. In forming the TiN film, Ti is used as the sputtering target and $N_2$ is used as the sputtering gas, for instance. For example, the conditions for forming the TiN film are set as follows. That is, the DC power is set to be 5 kW, and the temperature is set to be 100 degrees Celsius. For example, the insulating film 10 is comprised of $SiO_2$ and its thickness is set to be 100 nm. In forming the $SiO_2$ film, tetraethylorthosilicate (TEOS) is used, for instance.

Figure 2E:
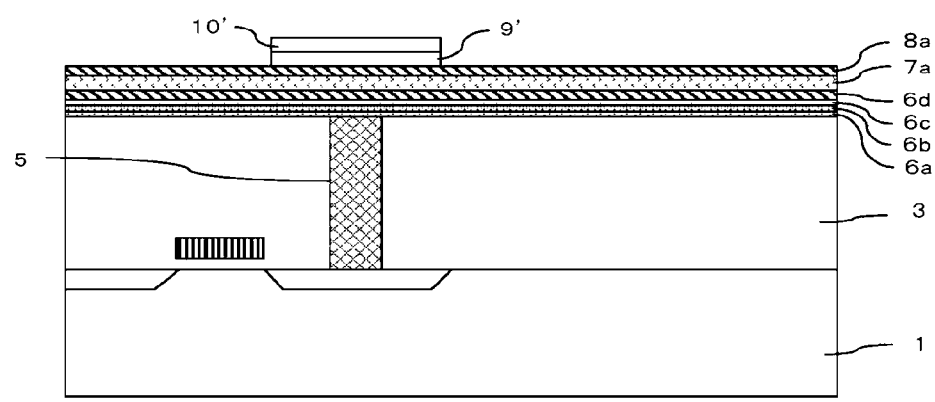
Figure 2F:
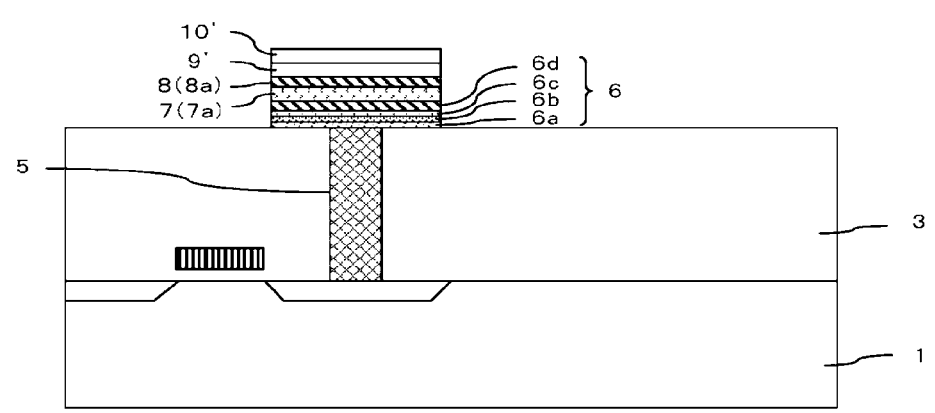

Next, as shown in FIG. 2E, the etching masks 10' and 9' are formed by sequentially patterning the insulating film 10 and the conductive film 9 with normal photolithography and etching. Also, a mixed gas of octafluorocyclobutane ($C_4F_8$), Ar and $O_2$ is used as the etching gas in etching the insulating film 10 comprised of $SiO_2$. For example, the conditions for etching the insulating film 10 are set as follows. That is, the gas flow rate of $C_4F_8$, Ar, and $O_2$ is set to be 20, 500, and 10 sccm, respectively. The RF power is set to be 1.5 kW. The chamber pressure is set to be 40 mTorr. The stage temperature is set to be 20 degrees Celsius. On the other hand, a mixed gas of boron trichloride ($BCl_3$) and $Cl_2$ is used as the etching gas in etching the conductive film 9 comprised of TiN, for instance. For example, the conditions for etching the conductive film 9 are set as follows. That is, the gas flow rate of $BCl_3$ and $Cl_2$ is set to be 20 and 20 sccm, respectively. The RF power is set to be 700 W. The chamber pressure is set to be 2 mTorr. The stage temperature is set to be 80 degrees Celsius. After the conductive film 9 and the insulating film 10 are patterned, the resist used for etching the conductive film 9 and the insulating film 10 is eliminated by $O_2$ plasma ashing and sulfate ($H_2SO_4$) cleaning. Thus, an etching mask with a dual-layer structure is formed which includes the etching mask 9' comprised of the conductive film 9 and the etching mask 10' comprised of the insulating film 10.

The reason that the etching mask has a dual-layer structure having the etching mask 9' comprised of TiN and the etching mask 10' comprised of $SiO_2$ is herein explained. TiN that is used as the material of the etching mask 9' has high etch selectivity with the conductive film $6a$ (i.e., TiAlN), the conductive film $6b$ (i.e., Ir), the conductive film $6c$ (i.e., $IrO_2$), the conductive film $6d$ (i.e., Pt), the ferroelectric film $7a$ (i.e., SBT), and the conductive film $8a$ (i.e., Pt). Therefore, etching with high anisotropy can be conducted by using TiN as the etching mask, and thus a cross-section of the capacitor can be etched in a desired shape. However, if etching is conducted while the etching mask 9' comprised of TiN is exposed, the portion formed by the upper side and lateral sides of the etching mask 9' tends to be etched. This portion corresponds to the upper corners of the etching mask 9' when it is seen in the cross-section diagram as shown in FIG. 2E. Thus, throughout the etching, the cross-section shape of the etching mask 9' may gradually take a trapezoid form. Therefore, in order to inhibit etching of the portions formed by the upper side and lateral sides of the etching mask 9', the etching mask 10' comprised of $SiO_2$ is laminated on the etching mask 9' comprised of TiN.

Next, as shown in FIG. 2F, the conductive film $8a$ (i.e., Pt), the ferroelectric film $7a$ (i.e., SBT), the conductive film $6d$ (i.e., Pt), the conductive film $6c$ (i.e., $IrO_2$), the conductive film $6b$ (i.e., Ir), the conductive film $6a$ (i.e., TiAlN) are sequentially etched by using the etching masks 9' and 10' as masks. Here, the conditions for etching the conductive film $8a$, etching the ferroelectric film $7a$, and etching the conductive films $6d$, $6c$, $6b$, and $6a$, are different from each other. However, the etching conditions for each of the conductive films $6d$, $6c$, $6b$, and $6a$ are the same. Therefore, three etching steps are conducted for etching the conductive film $8a$, the ferroelectric film $7a$, and the conductive films $6d$, $6c$, $6b$, and $6a$. For example, a mixed gas of $Cl_2$ and $O_2$ is used as the etching gas to etch the conductive film $8a$ comprised of Pt. For example, the conditions for etching the conductive film $8a$ are set as follows. That is, the gas flow rate of $Cl_2$ and $O_2$ is set to be 5 and 15 sccm, respectively. The RF power of 13.56 MHz is set to be 1 kW and the RF power of 450 kHz is set to be 100 W. The chamber pressure is set to be 2 mTorr. The stage temperature is set to be 450 degrees Celsius. Also, instead of using a mixed gas of $Cl_2$ and $O_2$, a mixed gas of $Cl_2$ and Ar, or a mixed gas of $Cl_2$, $O_2$ and Ar may be used here. In etching the ferroelectric film $7a$ comprised of the SBT film, a mixed gas of $Cl_2$ and Ar is used as the etching gas, for instance. For example, the conditions for etching the ferroelectric film $7a$ are set as follows. That is, the gas flow rate of the $Cl_2$ and Ar is set to be 10 and 10 sccm, respectively. The RF power of 13.56 MHz is set to be 550 W, and the RF power of 450 kHz is set to be 120 W. The chamber pressure is set to be 1 mTorr. The stage temperature is set to be 80 degrees Celsius. Also, instead of using the mixed gas of $Cl_2$ and Ar, $Cl_2$ gas, a mixed gas of $Cl_2$ and $O_2$, or a mixed gas of $Cl_2$, $O_2$, and Ar may be used as the etching gas. In etching the conductive film $6d$ comprised of the Pt film, the conductive film $6c$ comprised of the $IrO_2$ film, the conductive film $6b$ comprised of the Ir film, and the conductive film 6a comprised of the TiAlN film, a mixed gas of $Cl_2$ and $O_2$ is used as the etching gas, for instance. For example, the conditions for etching the conductive films 6d, 6c, 6b, and 6a are set as follows. That is, the gas flow rate of $Cl_2$ and $O_2$ is set to be 5 and 15 sccm, respectively. The RF power of 13.56 MHz is set to be 1 kW, and the RF power of 450 kHz is set to be 100 W. The chamber pressure is set to be 1 or 2 mTorr. The stage temperature is set to be 450 degrees Celsius. Also, instead of using a mixed gas of $Cl_2$ and $O_2$, a mixed gas of $Cl_2$, $O_2$, and Ar may be used as the etching gas. Thus, the lower electrode 6 comprised of the conductive films 6a, 6b, 6c, and 6d, the capacitor insulating film 7 comprised of the ferroelectric film 7a, and the upper electrode 8 comprised of the conductive film 8a are formed.

Here, as described in the manufacturing process in accordance with FIG. 2B, the following conditions are met. That is, both the thickness of the conductive film 6b comprised of the Ir film and that of the conductive film 6c comprised of the $IrO_2$ film are set to be 50 nm, and the thickness of the laminated film of the conductive films 6b and 6c is set to be 100 nm or less. Therefore, when the conductive films 6d, 6c, 6b, and 6a are simultaneously etched, the amount of a sidewall film that is formed on the sides of the capacitor insulating film 7 and the upper electrode 8 and is comprised of the reaction products generated by chemical reactions between Ir and the etching gas is a predetermined amount or less. In other words, even if a sidewall film comprised of the reaction products generated by chemical reactions between Ir and the etching gas is formed on the sides of the lower electrode 6, the capacitor insulating film 7, and the upper electrode 8, the leakage current generated between the upper electrode 8 and the lower electrode 6 is reduced to a level that does not influence the operation of the ferroelectric memory.

Figure 2G:
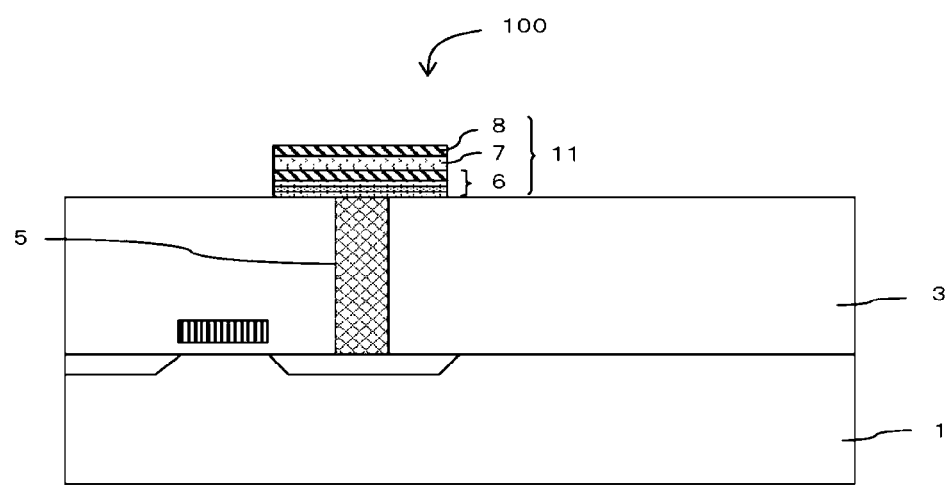

Next, as shown in FIG. 2G, the etching masks 10' and 9' are eliminated. In eliminating the etching mask 10' comprised of $SiO_2$, a mixed gas of $C_4F_8$, Ar, and $O_2$ is used as the etching gas, for instance. For example, the conditions for etching the etching mask 10' are set as follows. That is, the gas flow rate of the $C_4F_8$, Ar, and $O_2$ is set to be 20, 500, and 10 sccm, respectively. The RF power is set to be 1.5 kW. The chamber pressure is set to be 40 mTorr. The stage temperature is set to be 20 degrees Celsius. In eliminating the etching mask 9' comprised of TiN, a mixed gas of $BCl_3$ and $Cl_2$ is used as the etching gas, for instance. For example, the conditions for etching the etching mask 9' are set as follows. That is, the gas flow rate of the $BCl_3$ and $Cl_2$ is set to be 20 and 20 sccm, respectively. The RF power is set to be 700 W. The chamber pressure is set to be 2 mTorr. The stage temperature is set to be 80 degrees Celsius. Thus, the ferroelectric capacitor 11 comprised of the lower electrode 6, the capacitor insulating film 7, and the upper electrode 8 is formed.

Furthermore, other elements such as an interlayer insulating film and a main wiring are formed in subsequent processes, and thus the ferroelectric memory cell 100 is formed. However, these other elements are not directly related to the present invention. Therefore, explanations of them are omitted here.

According to the first embodiment of the present invention, the minimum thickness of the conductive film 6b comprised of Ir and that of the conductive film 6c comprised of $IrO_2$ are set to be 1 nm, respectively. In addition, the thickness of the laminated film of the conductive films 6b and 6c is set to be 100 nm or less. Because of this, the conductive films 6b and 6c can function as oxidation barrier films with respect to the plug 5, and the amount of a sidewall film that is formed on the sides of the ferroelectric capacitor 11 and comprised of the reaction products generated by chemical reactions between Ir and the etching gas can be reduced to a predetermined amount or less. In other words, even if a sidewall film comprised of the reaction products generated by chemical reactions of Ir and the etching gas is formed on the sides of the ferroelectric capacitor 11, the leakage current generated between the upper electrode 8 and the lower electrode 6 can be reduced to a level that does not influence the operation of the ferroelectric memory. Therefore, the reliability and production yield of the ferroelectric memory can be improved.

This application claims priority to Japanese Patent Application No. 2005-061954. The entire disclosure of Japanese Patent Application No. 2005-061954 is hereby incorporated herein by reference.

The terms of degree such as "substantially" and "nearly" used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:
   preparing a semiconductor substrate;
   forming a lower electrode which is a laminate comprised of a layer of Ir and a layer of $IrO_2$ over the semiconductor substrate;
   forming a capacitor insulating film comprised of a metal oxide dielectric on the lower electrode; and
   forming an upper electrode comprised of a precious metal film on the capacitor insulating film,
   wherein the Ir film and the $IrO_2$ film have a combined thickness of 100 nm or less so that leakage current of the semiconductor device is reduced, and
   wherein the laminate comprising the lower electrode further comprises a hydrogen diffusion barrier film provided proximate to the semiconductor layer and under a lower surface of the layer of Ir, and a conductive film comprised of a precious metal provided on the layer of $IrO_2$ in contact with the capacitor insulating film which functions to reduce Ir diffusion.

2. The method according to claim 1, wherein the Ir layer has a thickness of 1 nm or more.

3. The method according to claim 1, wherein the layer of $IrO_2$ has a thickness of 1 nm or more.

4. The method according to claim 1, wherein the hydrogen diffusion barrier film is composed of TiAlN.

5. The method according to claim 1, wherein the precious metal film of the upper electrode consists of Pt.

6. The method according to claim 1, wherein the precious metal of the conductive film consists of Pt.

7. The method according to claim 1, wherein the metal oxide dielectric is comprised of one compound selected from the group consisting of a SBT compound, a PZT compound, and a BLT compound.

8. The method according to claim 1, wherein a laminated film including a layer of TiN and a layer of SiO$_2$ is used as an etching mask in the steps of forming the lower electrode, forming the capacitor insulating film, and forming the upper electrode.

9. The method according to claim 1, further comprising the steps of forming a field-effect transistor having a diffusion layer on the semiconductor substrate and connecting the diffusion layer of the field-effect transistor with the lower electrode by means of a plug.

10. A method for manufacturing a semiconductor device, comprising the steps of:
preparing a semiconductor substrate;
forming a lower electrode over the semiconductor substrate which is a laminate;
comprised of, in the order recited, a TiAlN film provided on the semiconductor substrate, an Ir film, an IrO$_2$ film, and a conductive film consisting of Pt;
forming a capacitor insulating film comprised of a metal oxide dielectric on the lower electrode; and
forming an upper electrode comprised of a precious metal film on the capacitor insulating film,
wherein the Ir film and the IrO$_2$ film each has a respective thickness of 1 nm or more and have a combined thickness of 100 nm or less so that leakage current of the semiconductor device is reduced.

11. A method for manufacturing a semiconductor device, comprising the steps of:
preparing a semiconductor substrate;
forming a lower electrode over the semiconductor substrate which is a laminate comprised of, in the order recited, a hydrogen diffusion barrier film provided on the semiconductor substrate, an Ir film, an IrO$_2$ film, and a precious metal film consisting of Pt;
forming a capacity insulating film comprised of a metal oxide dielectric on said lower electrode; and
forming an upper electrode comprised of a precious metal film on said capacity insulating film,
wherein the Ir film and the IrO$_2$ film each has a respective thickness of 1 nm or more and have a combined thickness of 100 nm or less so that leakage current of the semiconductor device is reduced.

* * * * *